(12) United States Patent
Ye et al.

(10) Patent No.: US 6,753,500 B2
(45) Date of Patent: Jun. 22, 2004

(54) METHOD AND APPARATUS FOR CUTTING A SUBSTRATE USING LASER IRRADIATION

(75) Inventors: Kaidong Ye, Singapore (SG); Chengwu An, Singapore (SG); Minghui Hong, Singapore (SG); Yongfeng Lu, Singapore (SG)

(73) Assignee: Data Storage Institute (SG)

( * ) Notice: Subject to any disclaimer, the term of this patent is extended or adjusted under 35 U.S.C. 154(b) by 74 days.

(21) Appl. No.: 10/078,720

(22) Filed: Feb. 19, 2002

(65) Prior Publication Data

US 2003/0155333 A1 Aug. 21, 2003

(30) Foreign Application Priority Data

Jul. 6, 2001 (SG) ........................ 200104056-7

(51) Int. Cl.$^7$ .............................................. B23K 26/00
(52) U.S. Cl. ........................ 219/121.72; 219/121.67; 219/121.68; 219/121.69
(58) Field of Search .................. 219/121.72, 121.67, 219/121.68, 121.69, 121.85

(56) References Cited

U.S. PATENT DOCUMENTS

| | | | |
|---|---|---|---|
| 4,358,659 A | | 11/1982 | Spohnheimer |
| 5,151,389 A | * | 9/1992 | Zappella ...................... 438/68 |
| 5,624,587 A | | 4/1997 | Otsuki et al. |
| 6,087,618 A | | 7/2000 | Wiener-Avnear et al. |
| 6,140,606 A | * | 10/2000 | Heikilla et al. ........ 219/121.82 |
| 6,140,708 A | | 10/2000 | Lee et al. |
| 6,498,319 B1 | * | 12/2002 | Matsumoto et al. ... 219/121.72 |
| 2001/0035401 A1 | * | 11/2001 | Manor ................... 219/121.72 |
| 2001/0054606 A1 | * | 12/2001 | Weishauss et al. ..... 219/121.83 |

FOREIGN PATENT DOCUMENTS

| | | |
|---|---|---|
| DE | 4034745 | 7/1991 |
| EP | 1093881 | 4/2001 |
| JP | 3099479 | 4/1991 |
| TW | 85112862 | 6/1996 |
| WO | WO 9808414 | 3/1998 |
| WO | WO 9814302 | 4/1998 |
| WO | WO 01/10177 | 2/2001 |

* cited by examiner

*Primary Examiner*—M. Alexandra Elve
(74) *Attorney, Agent, or Firm*—Coats & Bennett, P.L.L.C.

(57) ABSTRACT

The invention relates to a method and apparatus for cutting a substrate using laser irradiation. A laser beam is scanned over a substrate. The beam ablates a first layer of the substrate. The beam is then refocused onto the newly revealed second layer and a further pass is performed. The process is repeated until complete separation occurs. The method and apparatus are particularly suitable for singulation of IC packages.

17 Claims, 6 Drawing Sheets

METHOD AND APPARATUS FOR CUTTING A SUBSTRATE USING LASER IRRADIATION

This invention relates to a method and apparatus for cutting a substrate using laser irradiation. In particular, it relates to such a method and apparatus for use with a substrate bearing integrated circuit components. The invention has particular application in the singulation of integrated circuit components using laser irradiation.

Silicon wafers or integrated circuit (IC) units are typically made up of a number of individual layers. These layers may comprise a printed circuit board (PCB) package upon which are provided some or all of the following; metal circuitry, dielectrics, wafer dies, bonding wires and moulding compound materials. Typically, a number of individual IC units will be formed on one package, which will be marked so as to define the boundaries of the individual IC units. It is therefore necessary to singulate the package so as to separate each individual IC unit.

A known singulation technique is that of mechanical sawing. U.S. Pat. No. 6,140,708 to Lee et al, entitled "Chip Scale Package And Method For Manufacture Thereof", discloses a manufacturing process in which the individual units are singulated from an encapsulated package using a diamond saw. This prior technique has many drawbacks. The saw must be manufactured to exacting standards of homogeneity and flatness. Water is also required during the sawing process to clean the sawing debris and to dissipate the heat generated. Another disadvantage is that the high degree of wear requires frequent saw replacement, which leads to high equipment costs. Furthermore, the minimum cut width of the saw imposes limitations on the density of IC unit fabrication. In addition, the mechanical sawing process can lead to cracks, particularly in relation to thinner IC units. In addition, metal substrates have recently gained in popularity due to their low cost. Typically, a substrate will have a copper plate base coated with a layer of nickel. However, metal substrates generate metal debris which can lead to even greater problems. The metal debris tends to stick to the saw blade, leading to damage to both the IC units and the saw blade itself.

Another technique for the singulation of IC units is that of laser singulation. WO 01/10177 (XSIL Technology Limited) discloses a method and apparatus for singulation of IC units using a laser. The laser energy is scanned across the IC package using either rotating or laterally moveable mirrors. This method also has drawbacks. The cutting speeds attained by using this technique are quoted as 4.2 mm/sec and 8.3 mm/sec. Furthermore, the thickness of package suitable for cutting using this technique is limited by the depth of focus of the laser beam. This technique is therefore not suitable for many industrial applications.

There is therefore a requirement for an improved method and apparatus avoiding the above disadvantages. In particular, there is a requirement for a method and apparatus for cutting a substrate using laser irradiation that avoids the problems of diamond-wheel saw dicing (e.g. cost of saw blades, frequent wear, large minimum cut width, cracking, need for water to remove debris and dissipate heat) while providing reasonable cutting speeds and being suitable for use with thicker substrates.

It is an object of the present invention to fulfil the above requirements.

According to the above object, the invention comprises a method of cutting a substrate comprising the steps of:

a) focussing laser energy onto a point on the substrate so as to provide a laser focus point on the substrate;

b) effecting relative lateral movement between the said laser focus point and the said substrate so that the said point follows a first path on the said substrate, a first layer of the said substrate being removed along the said first path so as to reveal a second layer of the said substrate;

c) refocussing the laser energy onto the said second layer, so that the laser focus point is located on the said second layer; and d) effecting relative lateral movement between the said laser focus point and the said substrate so that the said point again follows substantially the said first path on the said substrate, whereby a second layer of the said substrate is removed along the said first path.

Preferably, steps c) and d) are repeated, a further layer of the substrate being removed with each repetition, until all layers of the substrate have been removed along the said first path.

Advantageously, the laser energy used has a wavelength in the ultra-violet to visible range. Further advantageously, the laser energy used has a wavelength greater than 500 nm, preferably 532 nm Preferably, a fluid flow is directed towards the cut region. Particularly preferably, the said fluid is air.

According to one embodiment, the substrate is provided with a plurality of Integrated Circuit (IC) units formed thereon, the method being used to singulate the various units.

According to another aspect, the invention provides apparatus for carrying out the above method.

For a better understanding of the present invention and to show more clearly how it may be carried into effect reference will now be made, by way of example, to the accompanying drawings which show schematically various embodiments of the present invention. The figures may not be to scale.

Figure 1A:
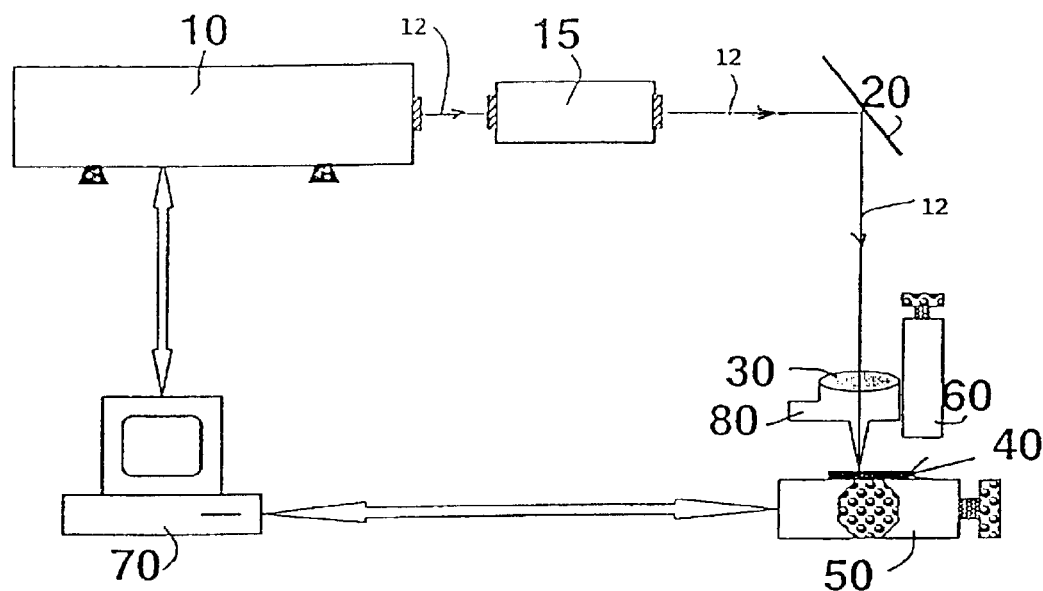
FIG. 1A shows an embodiment of an apparatus according to the invention.
Figure 1B:
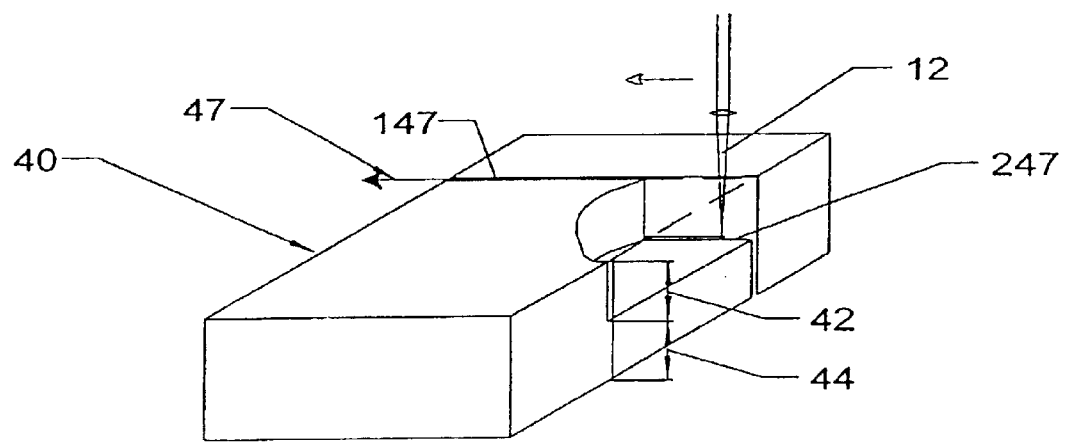
FIG. 1B is an enlarged partial view showing the invention used to cut a package.
Figure 2A:
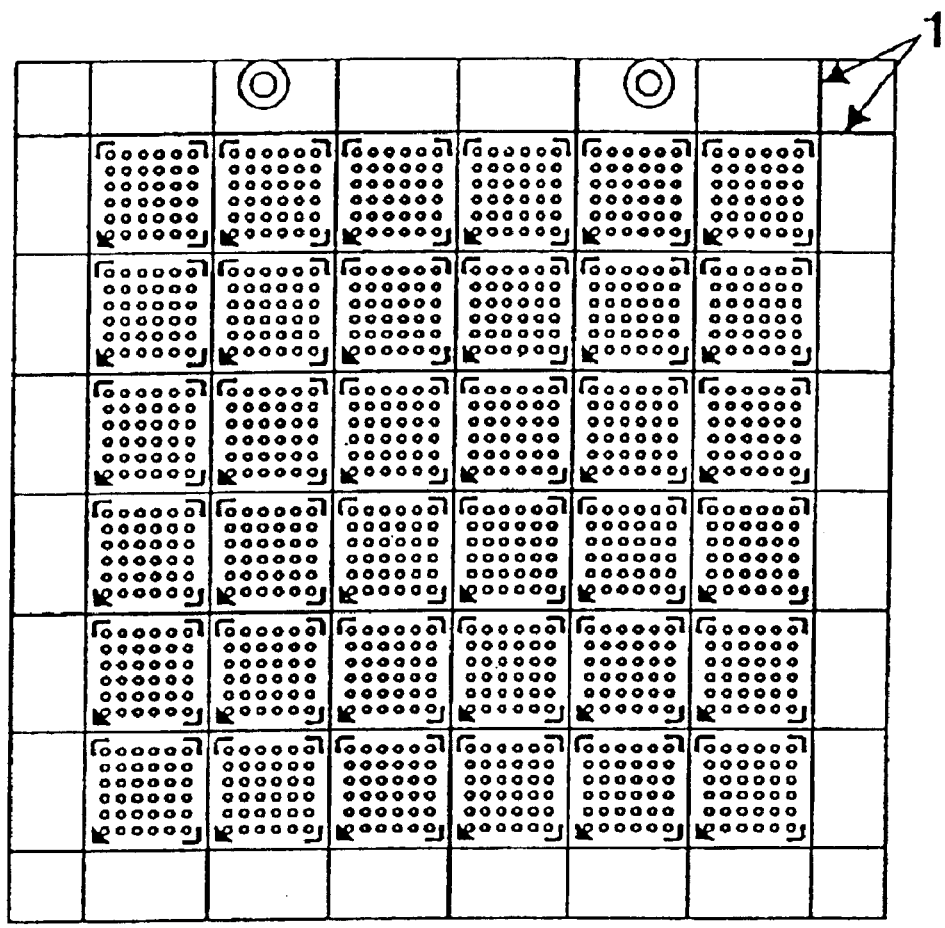
FIG. 2A shows a first type of uncut package, bearing a number of IC units, suitable for cutting using the invention.
Figure 2B:
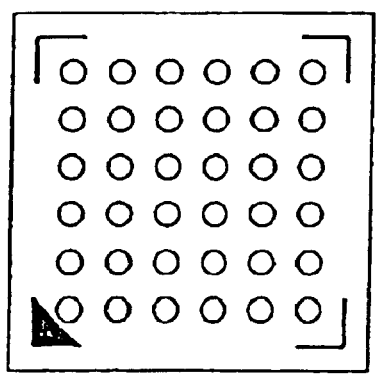
FIG. 2B shows an IC unit separated from the package of FIG. 2A.
Figure 3A:
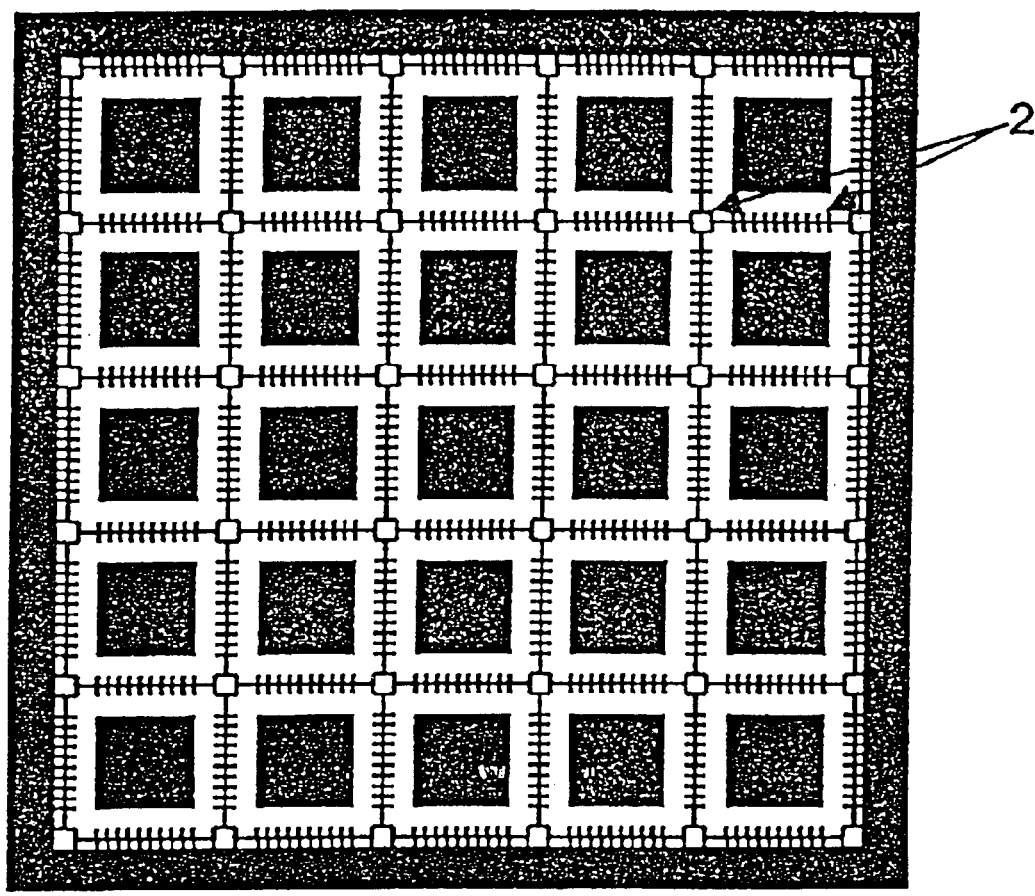
FIG. 3A shows a second type of uncut package, bearing IC units, suitable for cutting using the invention.
Figure 3B:
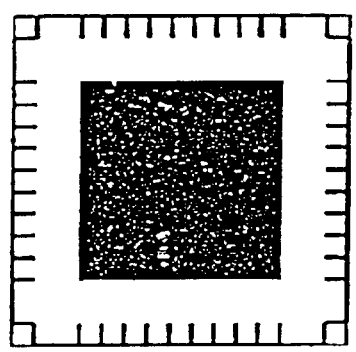
FIG. 3B shows an IC unit separated from the package of FIG. 3A.
Figure 4:
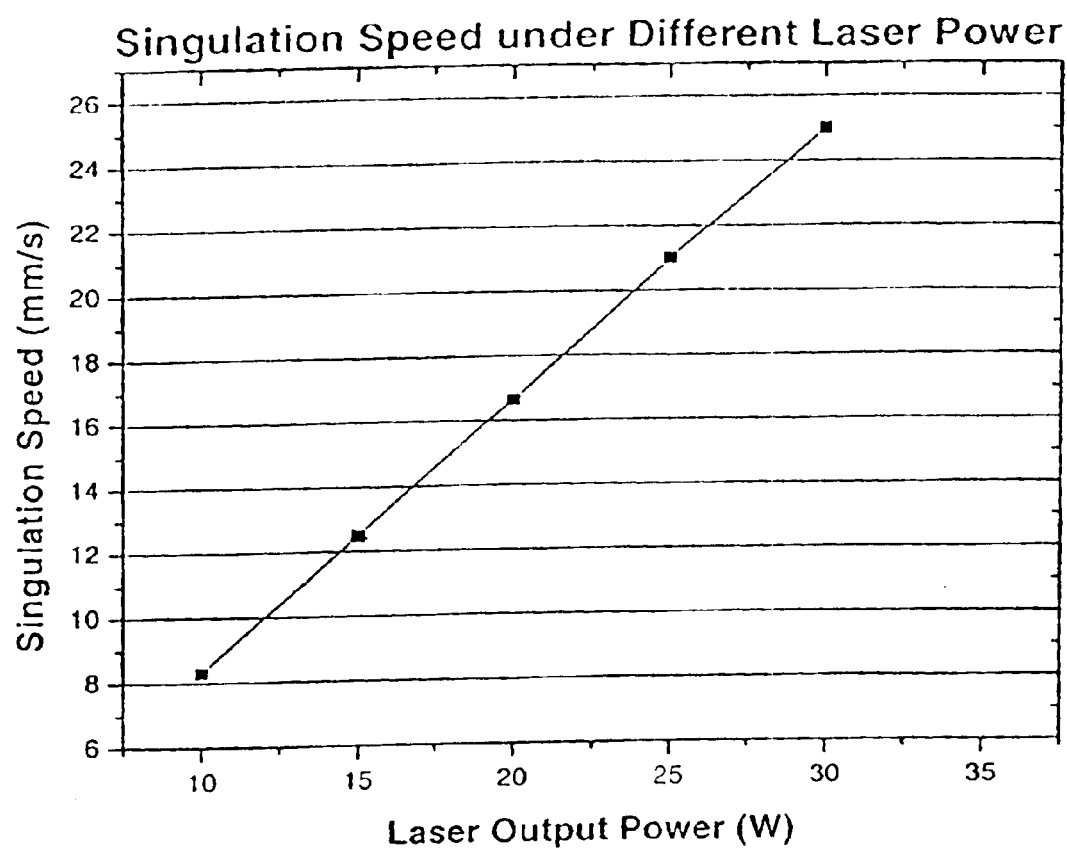
FIG. 4 is a graph showing the relationship between laser output power and cutting speed.

According to FIGS. 1A and 1B, a laser cutting apparatus according to one embodiment of the invention comprises an Nd:YAG laser (10) which generates a laser beam (12), a beam expander (15), a reflecting mirror (20), a Z-stage (60) and a lens (30) affixed thereto. The laser beam (12) passes through the beam expander (15) and is reflected by mirror (20) through lens (30) onto a package (40) which is carried by an X-Y stage (50) The package (40) has a number of IC units fabricated thereupon and may be of the type shown in FIG. 2A or 3A. A coaxial air blow system having an air blow nozzle (80) is provided to blow air onto the cut region. Relative movement between the package (40) and the laser beam (12) is provided by suitably controlling the movement of the X-Y stage (50). This movement may be controlled by a suitably programmed computer (70). The computer (70) also controls the laser (10) and the Z-stage (60). Suitable software is provided so that appropriate processing parameters can be selected, including laser parameters, X-Y stage parameters and Z-stage parameters.

At the start of the cutting process, the compressed air supply is initiated so that air is blown out of the nozzle (80) onto the surface of the package (40). The laser beam (12) is focussed onto the uppermost surface of the package. Under the control of the computer (70), the X-Y stage causes the package (40) to move, so that the laser beam moves along a cutting track (47). Alternatively, any suitable means for effecting suitable relative lateral movement may be employed. A first layer (42) of the package is ablated by the laser beam (12) and removed, exposing the second layer (44) and forming a first kerf (147). Once the laser beam has scanned to the end of the package, the beam is refocussed onto the now-revealed second layer (44). This is achieved by moving the lens (30) using the Z-stage (60), although any means for effecting suitable relative vertical movement may be employed, as may any other suitable refocussing means. In this way, real-time adjustment of laser optics is provided. Following the refocussing step, the beam passes back along the cutting track. During this pass, the second layer (44) is removed along the cutting path, forming a second kerf (247). The first and second kerfs (147, 247) together therefore separate the package along the path (47). In this example, two passes are sufficient to cut through the entire depth of the package (40), but for thicker packages more passes may be required. FIG. 1B shows a substrate having undergone a first pass and in the process of completing a second pass in the direction of the arrow shown (from right to left in FIG. 1B).

The scanning direction may be along the X or Y axes or a combination of the two. Each laser scan will therefore remove one layer of the material from the package. Following this scan, the focal lens is stepped down using the Z-stage to refocus the laser beam onto the next layer. The focal point is therefore always kept on the working layer of the IC package. The stepping distance of the lens can be calculated by dividing the IC package thickness by the number of scans.

An alternative method of operation is to move the laser focus point to its initial position after the first pass is completed. The laser may be turned off (e.g. by using a shutter) during this return step. In this way, the package has an opportunity to cool down during the return step.

During the cutting process, compressed air supplied by the nozzle (80) is used to remove the debris created by the ablation of the package material and to dissipate heat. The direction of the air flow is preferably the same as the laser incident direction. This debris-removal feature allows the cutting groove to remain clear of debris and ready for the next scanning step.

The above process is repeated in the X and Y directions so as to singulate the package (40) into separate IC units.

The cutting speed can be expressed according to the following equation:

$$V_s \propto k(v, p, \lambda, \theta, f) \times \frac{P}{(W \times H)}$$

where $V_s$ the cutting speed;

P is the laser power used in the process;

W is the cutting width;

H is the thickness of the package; and k is a proportionality factor dependent on the laser scanning speed (v), the laser wavelength ($\lambda$), the divergence of the laser beam ($\theta$), the air blow pressure (p) and the focussing of the laser beam (f).

It can be seen that the cutting speed $V_s$ is proportional to the laser power P and inversely proportional to the cutting width (W) and package thickness (H). The value of the proportionality factor k varies depending on the setup of the apparatus. The laser wavelength ($\lambda$) in particular can be selected depending on the material to be cut. In the case of copper, for example, the desired wavelength is in the ultra-violet band, which is more efficient when cutting metal. Furthermore, pulsed laser irradiation is used as this provides high peak power while generating less heat. The air blow pressure (p) has a threshold value at which the debris is completely removed. The focussing factor (f) determines the intensity of the incident radiation, as different beam sizes will be required for different cutting widths.

Figure 5:
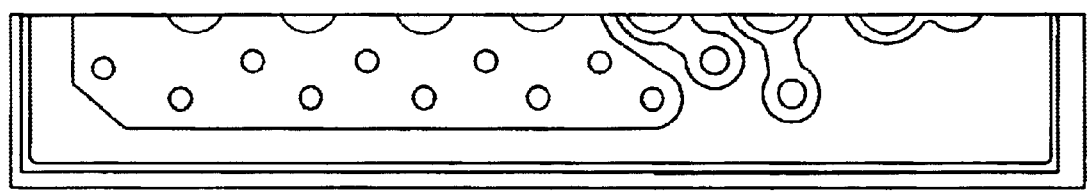
FIG. 5 is a microscope photo showing the cut edge of an IC package.
Figure 6:
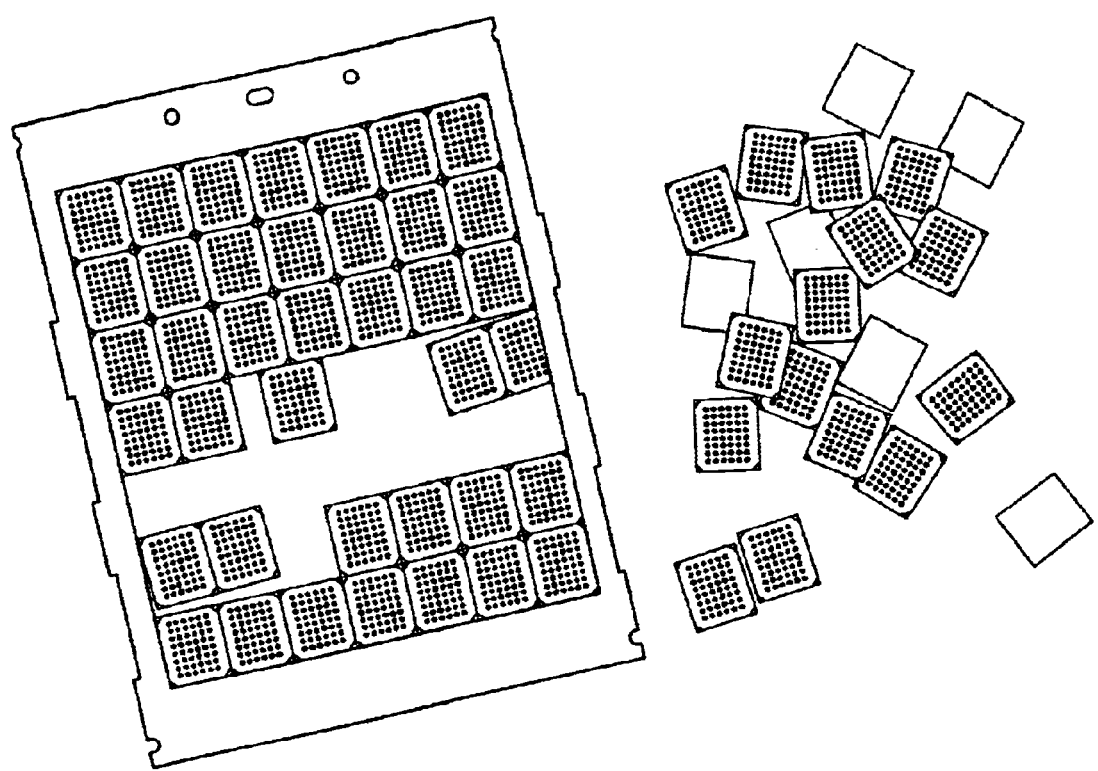
FIG. 6 is a photo showing a sample IC package with IC units cut using the present invention.

FIG. 5 shows the smooth cut edge obtained using the present invention. FIG. 6 shows a plurality of IC units separated from an IC package by using the invention. Using the invention, the speed of singulation and the quality of the cut edges are comparable to those obtained by mechanical saw singulation.

It is preferable to use high-speed multiple scans rather than low-speed single scans as the shorter beam-dwell-time results in less heat build-up. This feature, and the various other heat-dissipation features described above, allow heat accumulation to be avoided, so preventing damage due to overheating.

What is claimed is:

1. A method of cutting a substrate comprising the steps of:
    a) focusing laser energy onto a point on the substrate so as to provide a laser focus point on the substrate;
    b) effecting relative lateral movement between the said laser focus point and the said substrate so that the said point follows a first path on the said substrate, a first layer of the said substrate being removed along the said first path so as to reveal a second layer of the said substrate;
    c) refocusing the laser energy onto the said second layer, so that the laser focus point is located on the said second layer; and
    d) effecting relative lateral movement between the said laser focus point and the said substrate so that the said point again follows substantially the said first path on the said substrate, whereby a second layer of the said substrate is removed along the said first path.

2. A method according to claim 1 wherein steps c) and d) are repeated, a further layer of the substrate being removed with each repetition, until all layers of the substrate have been removed along the said first path.

3. A method according to claim 1 wherein the laser energy used has a wavelength in the ultra-violet to visible range.

4. A method according to claim 3 wherein the laser energy used has a wavelength greater than 500 nm.

5. A method according to claim 4 wherein the laser energy used has a wavelength of 532 nm.

6. A method according to claim 1 wherein a fluid flow is directed towards the cut region.

7. A method according to claim 6 wherein the said fluid is air.

8. A method according to claim 1 wherein the substrate is provided with a plurality of Integrated Circuit (IC) units formed thereupon, the method being used to singulate the various units.

9. An apparatus for cutting a substrate comprising:
a) a laser beam source;
b) focusing means for focusing the said laser beam onto a particular point on the substrate so as to provide a laser focus point on the substrate;
c) relative motion generating means configured to effect relative lateral movement between the said laser focus point and the said substrate so that the said laser focus point follows a first path on the said substrate, a first layer of the said substrate being removed along the said first path so as to reveal a second layer of the said substrate;
d) refocusing means for refocusing said laser focus point onto the said second layer of said substrate;
e) said relative motion means further configured to effect relative lateral movement between said laser focus point and said substrate to move said laser focus point along said first path again so as to remove a second layer of said substrate along said first path.

10. The apparatus according to claim 9 wherein the focusing means comprises a lens arrangement; the refocusing means comprising means for effecting relative vertical movement between the lens arrangement and the substrate.

11. The apparatus according to claim 9 wherein the laser beam wavelength is in the ultra-violet to visible range.

12. The apparatus according to claim 11 wherein the laser beam wavelength is greater than 500 nm.

13. The apparatus according to claim 12 wherein the laser beam wavelength is 532 nm.

14. The apparatus according to claim 9 further comprising means to direct a fluid flow towards a cut region created by moving said laser focus point along said first path.

15. The apparatus according to claim 14 wherein the said fluid is air.

16. The apparatus according to claim 9 wherein the substrate is provided with a plurality of Integrated Circuit (IC) units formed thereupon, the apparatus being used to singulate the plurality of IC units.

17. A method of cutting a substrate comprising:
focusing a laser beam onto a first layer of the substrate;
laterally moving the laser beam along a path on the substrate to remove the first layer of the substrate along the path and thereby reveal an underlying second layer of the substrate;
refocusing the laser beam onto the second layer of the substrate; and
laterally moving the laser beam along the same path on the substrate to remove the second layer of the substrate along the same path.

* * * * *